United States Patent
Huang et al.

(10) Patent No.: US 8,076,963 B2
(45) Date of Patent: Dec. 13, 2011

(54) DELAY-LOCKED LOOP HAVING A DELAY INDEPENDENT OF INPUT SIGNAL DUTY CYCLE VARIATION

(75) Inventors: Xuhao Huang, San Diego, CA (US);
Xiaohong Quan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 62 days.

(21) Appl. No.: 12/559,749

(22) Filed: Sep. 15, 2009

(65) Prior Publication Data

US 2011/0063005 A1   Mar. 17, 2011

(51) Int. Cl.
   *H03L 7/06* (2006.01)
(52) U.S. Cl. ........................................ 327/158; 327/149
(58) Field of Classification Search .................. 327/149, 327/158
   See application file for complete search history.

(56) References Cited

U.S. PATENT DOCUMENTS

| | | | |
|---|---|---|---|
| 6,133,861 A | 10/2000 | Jusuf et al. | |
| 7,365,583 B2* | 4/2008 | Shin | 327/158 |
| 7,649,390 B2* | 1/2010 | Shin | 327/158 |
| 7,671,646 B2* | 3/2010 | Cho et al. | 327/156 |
| 7,671,650 B2* | 3/2010 | Millar | 327/158 |
| 7,812,655 B2* | 10/2010 | Heinimaki | 327/158 |
| 7,821,309 B2* | 10/2010 | Lee | 327/158 |
| 7,821,316 B2* | 10/2010 | Fiedler | 327/231 |
| 2004/0080349 A1 | 4/2004 | Kawahito et al. | |
| 2007/0057714 A1 | 3/2007 | Holzle | |
| 2008/0303569 A1* | 12/2008 | Mai | 327/158 |
| 2009/0322390 A1* | 12/2009 | Shim | 327/158 |
| 2010/0052744 A1* | 3/2010 | Fiedler | 327/146 |
| 2010/0060334 A1* | 3/2010 | Abe et al. | 327/158 |
| 2010/0073053 A1* | 3/2010 | Shin | 327/158 |
| 2010/0214858 A1* | 8/2010 | Kang et al. | 365/193 |
| 2010/0237917 A1* | 9/2010 | Monma | 327/158 |

OTHER PUBLICATIONS

International Search Report and Written Opinion—PCT/US2010/048819, International Search Authority—European Patent Office—Dec. 16, 2010.

* cited by examiner

*Primary Examiner* — Lincoln Donovan
*Assistant Examiner* — Adam D Houston
(74) *Attorney, Agent, or Firm* — Jiayu Xu

(57) ABSTRACT

A Delay-Locked Loop (DLL) uses a delay line to delay a first signal by a "delay time", thereby generating a second signal. A capacitor is charged at a first rate starting at a first edge of first signal and continuing until an edge of the second signal. The capacitor is then discharged at a second rate until another edge of the first signal. A control loop controls the delay time such that the amount the capacitor is charged is the same as the amount the capacitor is discharged. The delay time is constant and is substantially independent of variations in the duty cycle of the first signal. In one example, duty cycle distortion cancellation is accomplished by changing the first rate proportionally with respect to changes in first signal duty cycle. In another example, the first and second rates are independent of the duty cycle of the first signal.

22 Claims, 11 Drawing Sheets

DELAY-LOCKED LOOP (PRIOR ART)
FIG. 1

DELAY-LOCKED LOOP

DELAY CONTROL UNIT

FIG. 10

CHAIN OF DELAY ELEMENTS

DELAY-LOCKED LOOP HAVING A DELAY INDEPENDENT OF INPUT SIGNAL DUTY CYCLE VARIATION

BACKGROUND INFORMATION

1. Technical Field

The disclosed embodiments relate to a Delay-Locked Loop (DLL) that delays a clock signal by an amount of time that is substantially constant and independent of variations in the duty cycle of the clock signal.

2. Background Information

Figure 1:
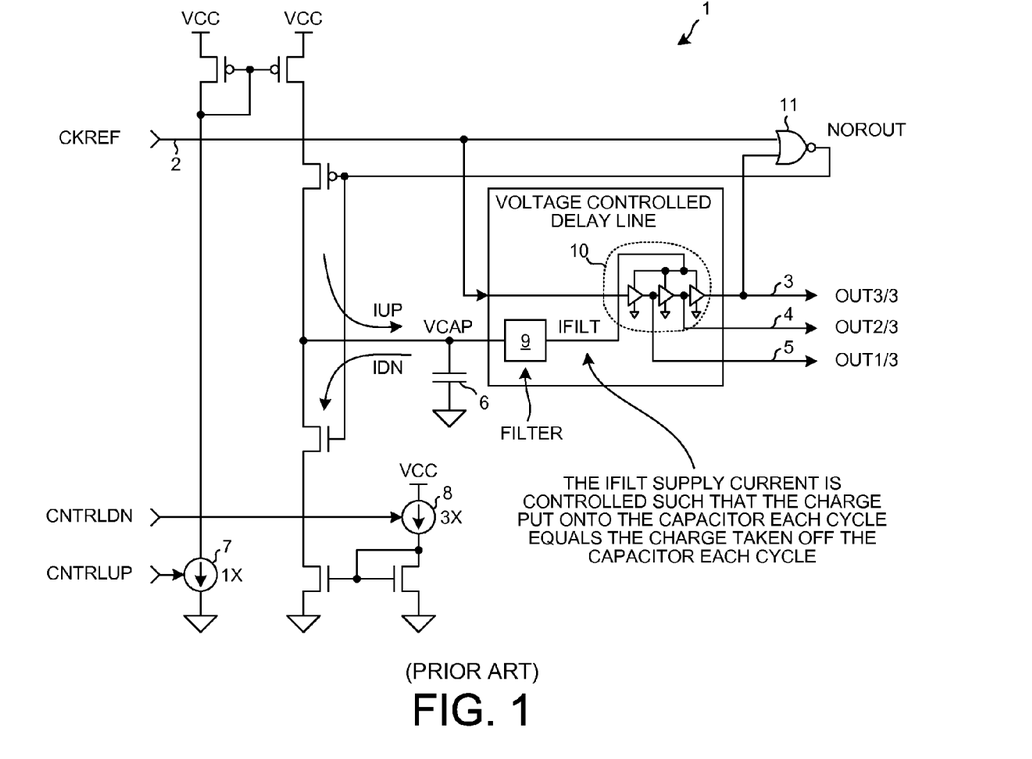
FIG. 1 (Prior Art) is a diagram of a Delay-Locked Loop (DLL) that receives an incoming clock signal CKREF on input lead 2 and outputs three delayed versions of CKREF on output leads 3, 4 and 5.

FIG. 1 (Prior Art) is a diagram of a Delay-Locked Loop (DLL) 1 that receives an incoming clock signal CKREF on input lead 2 and outputs three delayed versions of CKREF. A signal OUT3/3 on output lead 3 is a replica of signal CKREF that is delayed by a programmable delay time with respect to CKREF. Signal OUT2/3 on output lead 4 is a replica of signal CKREF that is delayed by two thirds of the programmable delay time. Signal OUT1/3 on output lead 5 is a replica of signal CKREF that is delayed by one third of the programmable delay time. The programmable delay time is determined by the ratio of a current IUP that charges up a capacitor 6 to a current IDN that discharges capacitor 6. The magnitude of up current IUP is determined by programmable current source 7. The magnitude of down current IDN is determined by programmable current source 8. The voltage signal on capacitor 6 is filtered and converted by a circuit 9 into a control current IFILT. Control current IFILT in this example is the supply current for a chain of inverters 10. The chain of inverters 10 delays the signal CKREF, thereby generating the output signals OUT1/3, OUT2/3 and OUT3/3. The larger the supply current IFILT, the smaller the delay. The smaller the supply current IFILT, the larger the delay. A feedback control loop involving a NOR gate 11 controls the delay through the chain of inverters 10 such that the charge supplied to capacitor 6 each cycle equals the charge withdrawn from capacitor 6 each cycle.

Figure 2:
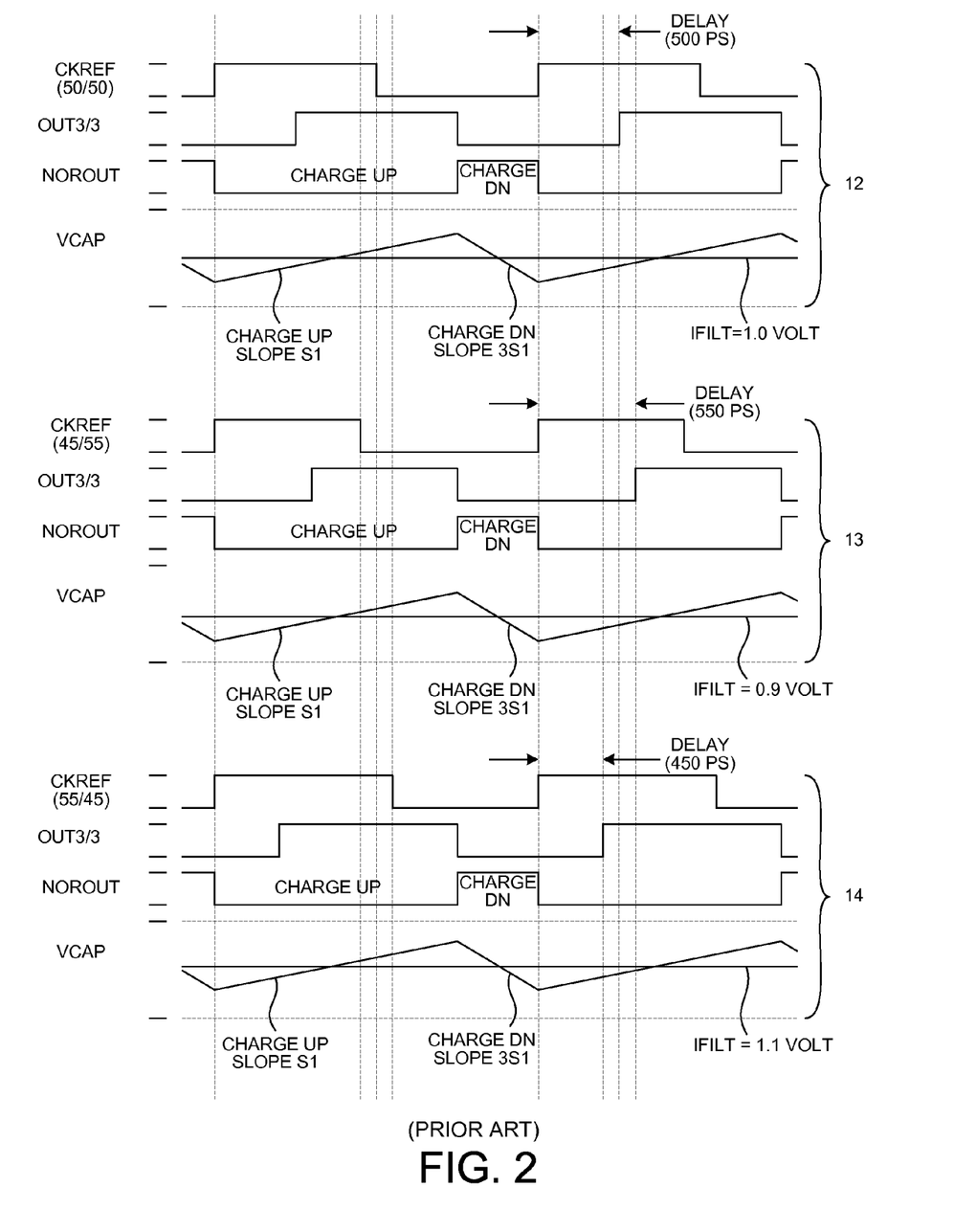
FIG. 2 (Prior Art) is a waveform diagram that illustrates operation of the DLL of FIG. 1.

FIG. 2 (Prior Art) is a waveform diagram that illustrates operation of DLL 1. Waveforms 12 illustrate operation of DLL 1 when CKREF has a 50/50 duty cycle. Waveforms 13 illustrate operation of DLL 1 when CKREF has a 45/55 duty cycle. Waveforms 14 illustrate operation of DLL 1 when CKREF has a 55/45 duty cycle. The voltage on capacitor 6 increases during the time NOR gate 11 outputs a digital logic low, and the voltage on capacitor 6 decreases during the time NOR gate 11 outputs a digital logic high. The control loop adjusts the delay of the chain of inverters 10 such that the charge up charge (charging capacitor 6) is equal to the charge down charge (discharging capacitor 6) during each cycle. Accordingly, if the duty cycle of a fixed frequency signal CKREF is fixed at 50/50, then the delay is fixed and is determined by the ratio of the up current IUP to the down current IDN as desired. DLL 1 is therefore usable to generate a delayed version of CKREF, where the amount of delay is programmable by setting the ratio of the IUP and IDN currents. Changes in duty cycle of CKREF, however, can cause changes in the delay time even if the frequency of CKREF remains constant and even if the ratio of IUP to IDN remains constant.

Figure 3:
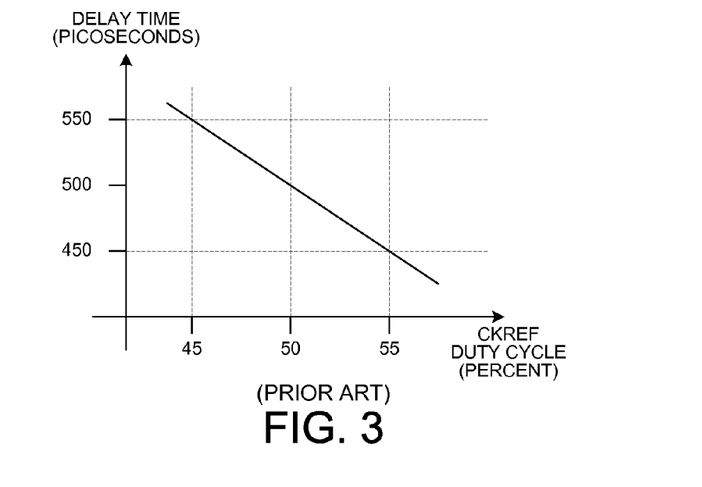
FIG. 3 (Prior Art) is a graph that shows how the delay between signal CKREF and signal OUT3/3 in the DLL of FIG. 1 changes as a function of the duty cycle of the signal CKREF.

FIG. 3 (Prior Art) is a graph that shows how the delay time between CKREF and OUT3/3 changes as a function of the duty cycle of CKREF.

SUMMARY

A Delay-Locked Loop (DLL) receives a first signal (for example, an incoming clock signal CKREF) and generates a second signal (for example, a delayed clock signal OUT3/3) using a delay line. The second signal is a delayed version of the first signal. The second signal is delayed with respect to the first signal by a "delay time." The delay time remains substantially constant despite possible changes in the duty cycle of the first signal. The DLL has general utility and sees many uses such as, for example, in controlling the enabling of a multi-stage driver that drives a data signal onto a serial bus conductor.

In a first embodiment, the DLL includes a capacitor. The capacitor is charged at a first rate starting at the time of a first edge of the first signal and continuing until the time of an edge of the second signal. Then, starting at the time of the edge of the second signal, the capacitor is discharged at a second rate. The capacitor is discharged in this way until the time of a second edge of the first signal. In one example, the first and second edges of the first signal are the rising and falling edges of a pulse of the first signal. A control loop of the DLL controls the "delay time" through the delay line such that during each period of the first signal the amount the capacitor is charged equals the amount the capacitor is discharged. By programming the ratio of the first rate (the capacitor charge rate) to the second rate (the capacitor discharge rate), the delay time can be set. The DLL automatically changes the first rate proportionally with respect to changes in the duty cycle of the first signal such that the delay time through the delay line remains substantially constant and independent of changes in the duty cycle of the first signal.

In a second embodiment, the DLL also includes a capacitor. As in the first embodiment, the capacitor is charged from the time of a first edge of the first signal until an edge of the second signal and the capacitor is then discharged from the time of the edge of the second signal until a second edge of the first signal. In the second embodiment, the edge of the second signal is a delayed version of and corresponds to the first edge of the first signal. The first and second edges of the first signal delimit one complete period of the first signal. In the second embodiment, both the charge rate and the discharge rate are substantially independent of changes in the duty cycle of the first signal. As in the first embodiment, the control loop of the DLL controls the delay time through the delay line such that during one period of the first signal the amount the capacitor is charged equals the amount the capacitor is discharged. The delay time through the delay line remains substantially constant and independent of changes in the duty cycle of the first signal.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or methods described herein, as defined solely by the claims, will become apparent in the non-limiting detailed description set forth herein.

DETAILED DESCRIPTION

Figure 4:
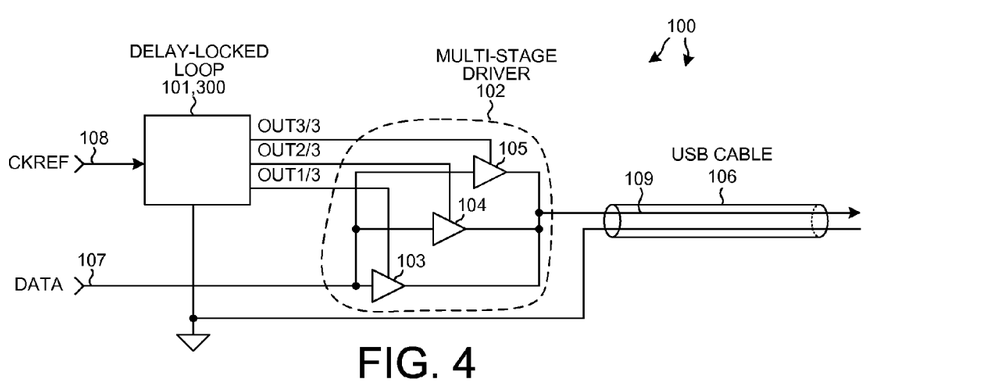
FIG. 4 is a simplified diagram of a system 100 in accordance with one novel aspect.

FIG. 4 is a simplified diagram of a system 100 in accordance with one novel aspect. System 100 includes a Delay-Locked Loop (DLL) 101 or 300, a multi-stage driver 102 involving drivers 103, 104 and 105, and a Universal Serial Bus (USB) cable 106. Bits of data DATA are received on lead 107 synchronously with respect to edges of a clock signal CKREF received on lead 108. When the logic level of the data signal is to change, the multi-stage driver 102 drives the new data level onto cable 106 with a graduated drive strength. The drive strength is graduated by first enabling only driver 103 so that driver 103 starts to drive conductor 109 to the new digital logic level. Then a short time later, driver 104 is enabled so that both driver 103 and driver 104 are driving conductor 109. Then a short time later, driver 105 is enabled so that all three drivers 103, 104 and 105 are driving conductor 109. The DLL provides the enable signals to the three drivers. Enable signal OUT1/3 transitions first, thereby enabling driver 103. Enabled signal OUT2/3 transitions next, thereby enabling driver 104. Enable signal OUT3/3 transitions next, thereby enabling driver 105. System 100 is but one illustrative application of the DLL. The DLL has many other applications.

Figure 5:
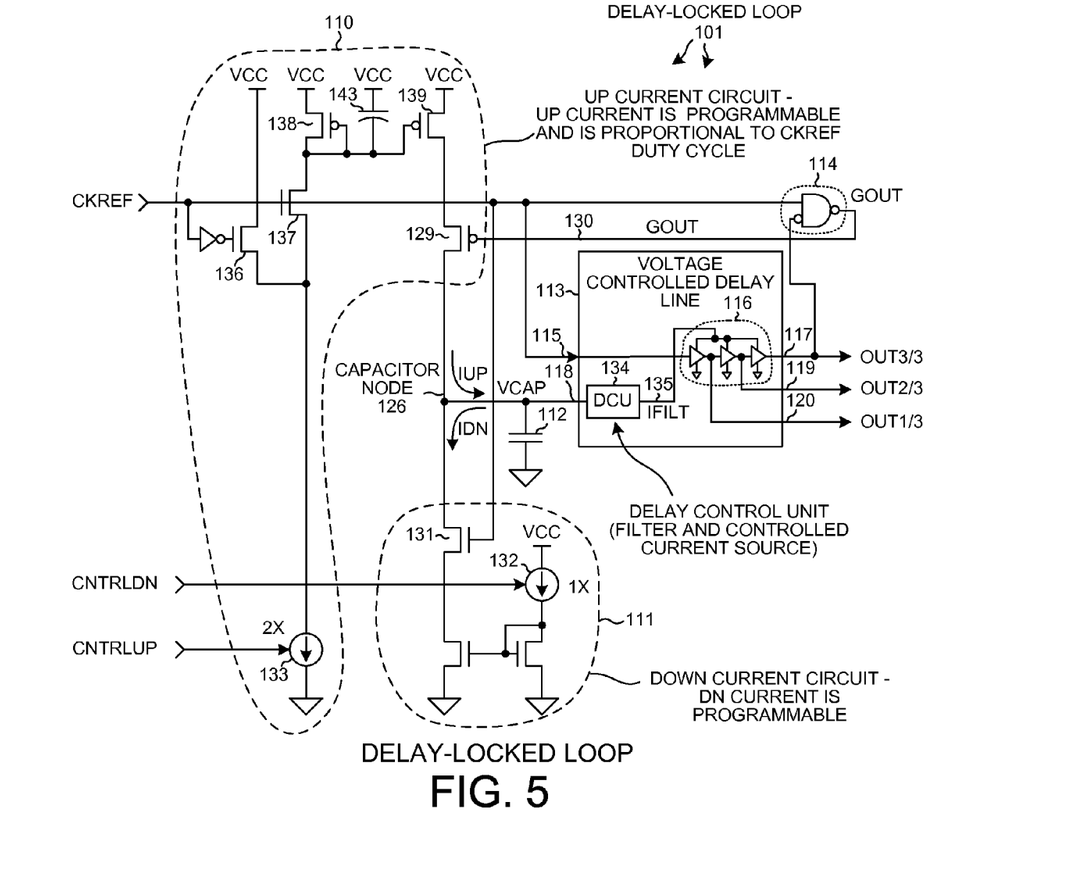
FIG. 5 is a circuit diagram of a first embodiment 101 of the DLL of the system of FIG. 4.

FIG. 5 is a detailed circuit diagram of a first embodiment 101 of the DLL of FIG. 4. The DLL includes an up current circuit 110, a down current circuit 111, a capacitor 112, a Voltage-Controlled Delay Line (VCDL) 113, and logic circuitry 114. Incoming clock signal CKREF is supplied to an input lead 115 of Voltage-Controlled Delay Line (VCDL) 113 such that a chain of delay elements 116 within VCDL 113 outputs a delayed version OUT3/3 of the clock signal onto output lead 117. The delay between an edge of incoming clock signal CKREF and a corresponding edge of output clock signal OUT3/3 is determined by the direct current (DC) component of an incoming voltage signal VCAP present on input lead 118 of VCDL 113. Other taps of the chain of delay elements 116 are extended out of VCDL 113 as output leads 119 and 120. Signal OUT1/3 on output lead 120 outputs a signal that is a delayed version of CKREF, but the delay between CKREF and OUT1/3 is one third of the delay between CKREF and OUT3/3. Signal OUT2/3 on output lead 119 outputs a signal that is a delayed version of CKREF, but the delay between CKREF and OUT2/3 is two thirds of the delay between CKREF and OUT3/3.

Figure 6:
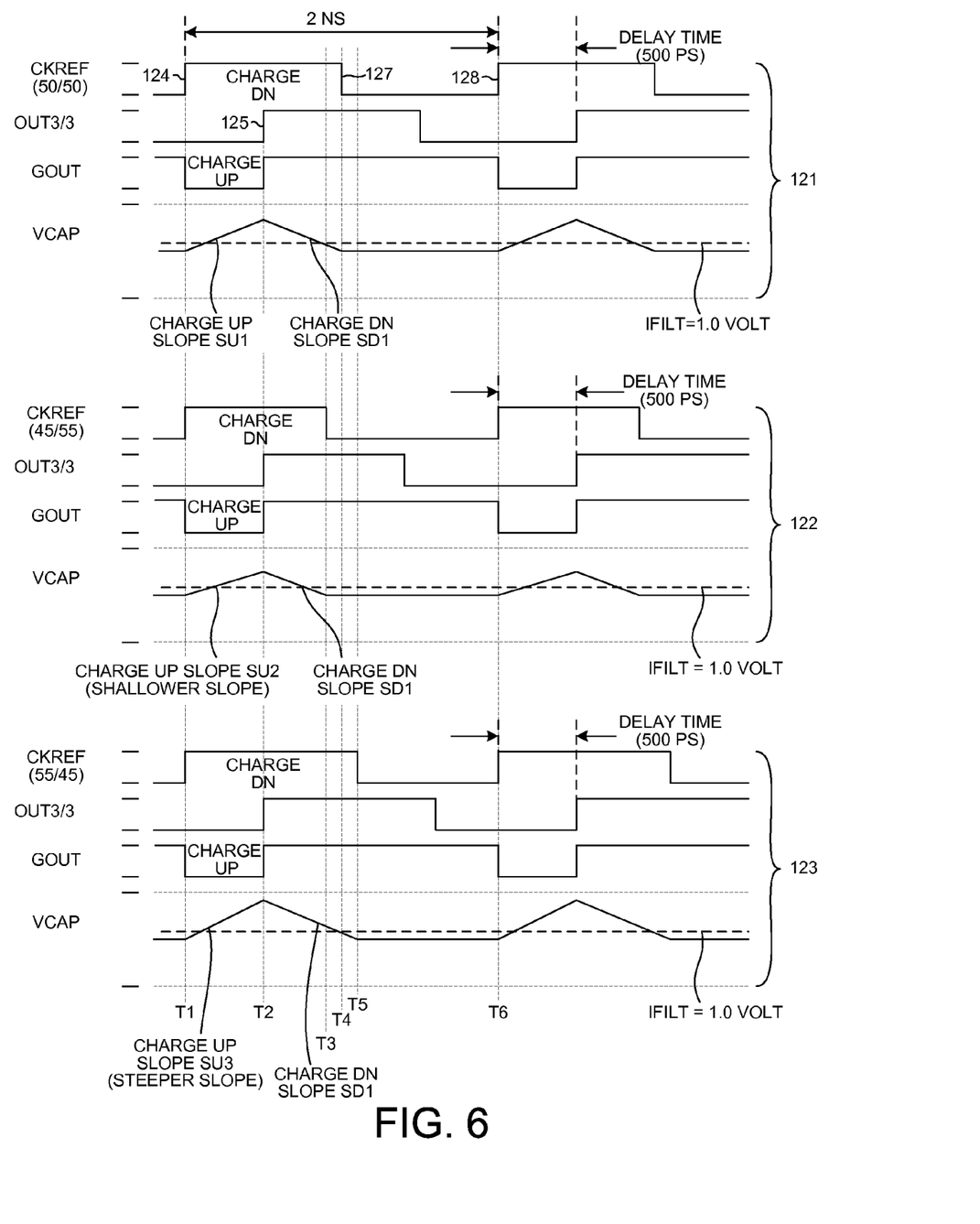
FIG. 6 is a waveform diagram that illustrates operation of the first embodiment 101 of the DLL of FIG. 5.

FIG. 6 is a waveform diagram that illustrates operation of the first embodiment 101 of the DLL of FIG. 5. Waveforms 121 illustrate operation of the DLL when CKREF has a 50/50 duty cycle. Waveforms 122 illustrate operation of the DLL when CKREF has a 45/55 duty cycle. Waveforms 123 illustrate operation of the DLL when CKREF has a 55/45 duty cycle. Starting on a first edge 124 at time T1 of a period of the incoming clock signal CKREF, the capacitor 112 is charged so that the voltage VCAP on capacitor 112 increases with a first rate SU1 as illustrated in FIG. 6. The voltage VCAP on capacitor 112 increases until a first edge 125 of signal OUT3/3 at time T2. Throughout this time, the up current circuit 110 is supplying current IUP onto a capacitor node 126 and down current circuit 111 is conducting current IDN from capacitor node 126. The magnitude of IUP is greater than the magnitude of current IDN, so net charge is added to capacitor 112 and the voltage VCAP increases at rate SU1 as illustrated.

Then, starting on edge 125 at time T2, the voltage VCAP on capacitor 112 decreases at a rate SD1. Current IUP stops flowing at time T2, but current IDN continues to flow, so charge is then removed from capacitor 112 and the voltage VCAP decreases as illustrated. This condition continues until the next edge 127 of signal CKREF at time T4. As illustrated in FIG. 6, the first and second edges 124 and 127 of the signal CKREF delimit a high pulse of the signal CKREF. At time T4, the down current circuit 111 stops withdrawing charge from node 126, and the voltage VCAP on capacitor 112 remains substantially fixed throughout the remainder of the period of signal CKREF at edge 128. A P-channel field effect transistor 129 is used to start and to stop the IUP current flow onto node 126. If transistor 129 is controlled to be conductive, then the current IUP flows. If transistor 129 is controlled to be non-conductive, then the current IUP does not flow. The signal GOUT that is output by logic circuitry 114 is supplied onto conductor 130 and onto the gate of transistor 129 as a control signal. When the signal CKREF is a digital logic high and the signal OUT3/3 is a digital logic low, then control signal GOUT on conductor 130 has a low digital logic level, thereby making transistor 129 conductive. The time period that signal GOUT is low and that transistor 129 is conductive is labeled "CHARGE UP" in the waveforms of FIG. 6.

An N-channel transistor 131 is used to start and to stop the IDN current flow from node 126. If transistor 131 is controlled to be conductive, then the current IDN flows. If transistor 131 is controlled to be nonconductive, then the current IDN does not flow. Signal CKREF is supplied onto the gate of transistor 131 so that transistor 131 will be conductive when signal CKREF has a digital logic high signal level. Accordingly, the IDN current flows when the signal CKREF has a high digital logic level as indicated by the label "CHARGE DN" in the waveforms of FIG. 6.

The rate at which VCAP increases between times T1 and T2 is determined by the magnitude of IUP minus the magnitude of IDN. The rate at which VCAP decreases between times T2 and T4 is determined by the magnitude of IDN. The magnitude of IDN can be adjusted by adjusting an analog control signal CNTRLDN. Analog control signal CNTRLDN controls controlled current source 132 of down current circuit 111. The magnitude of IUP can be adjusted by adjusting analog control signal CNTRLUP that controls controlled current source 133 of up current circuit 110. In the specific example illustrated in FIG. 5, the current flowing through current source 133 of the up current circuit 110 is set to be twice as large as the current flowing through current source 132 of the down current circuit 111.

As indicated in FIG. 5, the Voltage-Controlled Delay Line 113 includes a Delay Control Unit (DCU) 134 as well as the chain of delay elements 116. DCU 134 receives the voltage signal VCAP and from it generates a supply current IFILT. Supply current IFILT is supplied via node and conductor 135 to the chain of delay elements 116. The magnitude of the direct current DC voltage on node 135, which is identified with label IFILT in the waveforms of FIG. 6, is roughly proportional to the DC component of voltage VCAP. Likewise, the supply current supplied via node 135 to the chain of delay elements 116 is roughly proportional to the DC component of voltage VCAP. In the waveforms 121 of FIG. 6, the voltage on node 135 is approximately 1.0 volts.

The circuitry of FIG. 5 forms a control loop that controls the delay between signal CKREF and signal OUT3/3 (the delay of the chain of delay elements 116) such that the charge supplied onto capacitor 112 during each period of CKREF is substantially equal to the charge withdrawn from capacitor 112 during the period. Accordingly, by setting the relative magnitudes of currents IUP and IDN, the location of edge 125 between edges 124 and 127 (see FIG. 6) can be set. In the example of waveforms 121 of FIG. 6, the delay between CKREF and OUT3/3 is set to be five hundred picoseconds. The period of CKREF in the example is two nanoseconds.

The waveforms 122 of FIG. 6 illustrate operation of the DLL of FIG. 5 when the duty cycle of CKREF is 45/55. In the DLL of FIG. 5, changes in the magnitude of the up current IUP are made to be proportional to changes in the duty cycle of signal CKREF. Current IUP is therefore smaller in the 45/55 duty cycle waveform example 122 than it was in the 50/50 duty cycle waveform example 121. The rate of increase of voltage VCAP between the first edge 124 of signal CKREF and the first edge 125 of OUT3/3 is therefore a shallower slope SU2. The rate of decrease of voltage VCAP between the first edge 125 of signal OUT3/3 and the second edge 127 of signal CKREF is the same slope SD1 regardless of the duty cycle of CKREF. As stated above, the control loop operates to adjust the delay between signal CKREF and signal OUT3/3 such that the first edge 125 of signal OUT3/3 is situated between the two edges 124 and 127 of signal CKREF such that the charge supplied onto capacitor 112 during the CKREF signal period is equal to the charge withdrawn from capacitor 112 during the CKREF signal period. As a result, the delay between CKREF and OUT3/3 is substantially the same in the 45/55 duty cycle waveform example 122 as in the 50/50 duty cycle waveform example 121. The voltage of IFILT on node 135 of FIG. 5 in the 45/55 duty cycle waveform example 122 of FIG. 6 is the same 1.0 volts as in the 50/50 duty cycle waveform example 121 of FIG. 6.

The waveforms 123 of FIG. 6 illustrate operation of the DLL of FIG. 5 when the duty cycle of CKREF is 55/45. Because changes in the magnitude of current IUP are proportional to changes in the duty cycle of signal CKREF, the rate of increase of voltage VCAP between the first edge 124 of signal CKREF and the first edge 125 of OUT3/3 is a steeper slope SU3. The rate of decrease of voltage VCAP between the first edge 125 of signal OUT3/3 and the second edge 127 of signal CKREF is the same slope SD1 regardless of the duty cycle of CKREF. The control loop operates to adjust the delay between signal CKREF and signal OUT3/3 such that the first edge 125 of signal OUT3/3 is situated between the two edges 124 and 127 of signal CKREF such that the charge supplied onto capacitor 112 during the CKREF signal period is equal to the charge withdrawn from capacitor 112 during the CKREF signal period. As a result, the delay between CKREF and OUT3/3 is substantially the same in the 55/45 duty cycle waveform example 123 as in the 50/50 duty cycle waveform example 121. The voltage of IFILT on node 135 of FIG. 5 in the 55/45 duty cycle waveform example 123 is the same 1.0 volts as in the 50/50 duty cycle waveform example 121.

Figure 7:
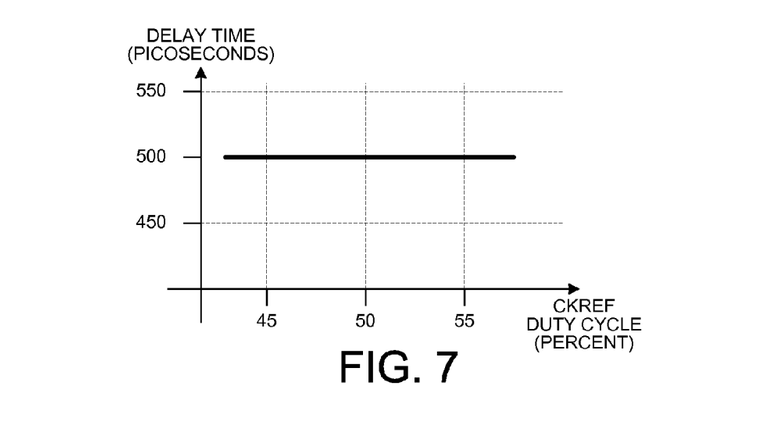
FIG. 7 is a chart that illustrates how the "delay time" between corresponding edges of the signal CKREF and OUT3/3 in the DLL 101 of FIG. 4 remains substantially constant despite duty cycle changes in the signal CKREF.

FIG. 7 is a chart that illustrates how the delay time between the signal CKREF and OUT3/3 remains substantially constant at 500 picoseconds despite duty cycle changes in the signal CKREF over the range of from a 45/55 duty cycle to a 55/45 duty cycle. The delay time to duty cycle relationship illustrated in FIG. 7 is relatively constant as compared to the varying delay time to duty cycle relationship of the prior art illustrated in FIG. 3 (Prior Art).

There are many ways that up current circuit 110 can be realized. In the simplified example set forth in FIG. 5, up current circuit 110 supplies an IUP current whose magnitude varies proportionally with changes in the duty cycle of CKREF. IUP is made to vary in this way by switching two current paths. Each of these current paths extends through the same current source 133. The first current path extends from the drain of N-channel transistor 136, to the source of N-channel transistor 136, and then through current source 133 and to a ground node. The second current path extends from the drain of N-channel transistor 137, to the source of N-channel transistor 137, and then through current source 133 and to the ground node. The fixed current sinked into current source 133 is either steered to flow through the first current path or the second current path depending on the digital logic level of the signal CKREF. The current source current only flows through the second current path if the digital logic level of the signal CKREF is a digital logic high. Accordingly, the average current flow through the second current path varies in proportion to the duty cycle of signal CKREF due to filtering by capacitor 143. This current flowing through the second current path is mirrored by current mirroring transistors 138 and 139 into the current IUP. The current IUP is the source-to-drain current flowing through transistor 139.

Figure 8:
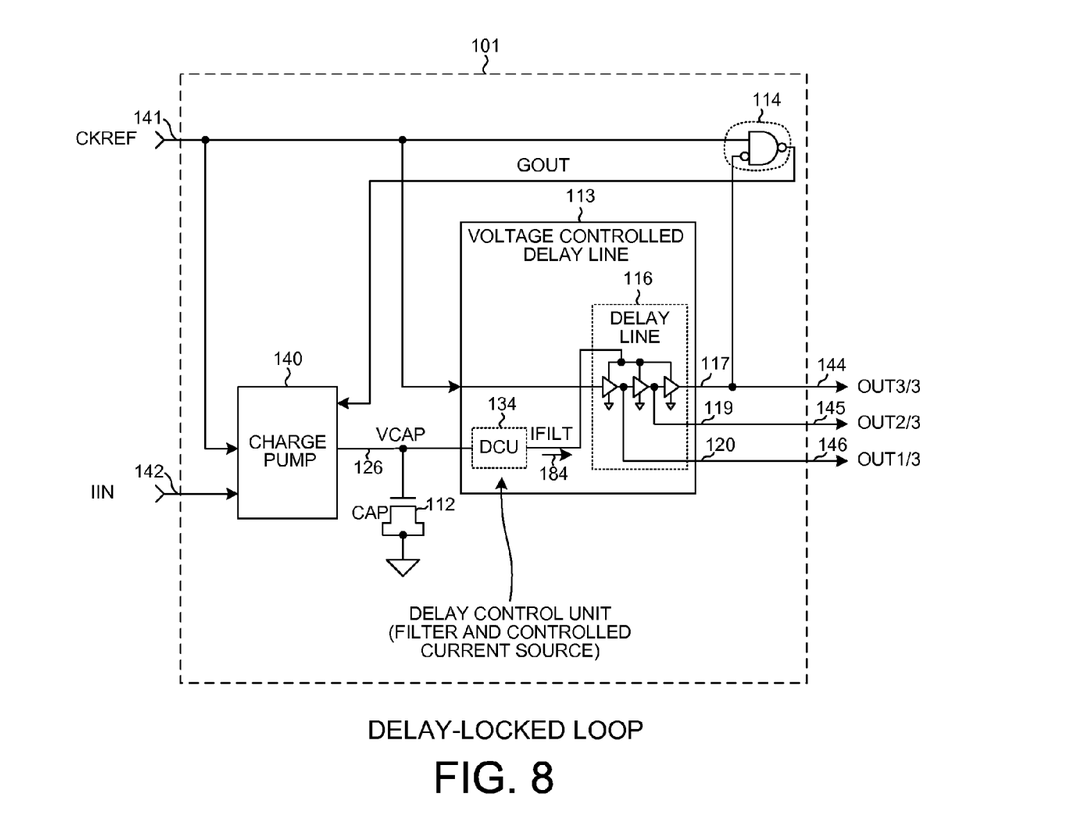
FIG. 8 is a diagram of a specific example of the first embodiment 101 of the DLL of FIG. 4.

FIG. 8 is a diagram of a specific example of the first embodiment 101 of the DLL of the system of FIG. 4. In the example of FIG. 8, there is no CNTRLUP control input signal or CNTRLDN input signal. The up current circuit 110 and the down current circuit 111 are referred to together as a charge pump 140. Capacitor 112 is realized as an N-channel field effect transistor. The DLL has a CKREF signal input lead 141, an input current input lead 142, an OUT3/3 output lead 144, an OUT2/3 output lead 145, and a OUT1/3 output lead 146. Signal OUT1/3 is delayed with respect to CKREF one third as much as signal OUT3/3 is delayed with respect to CKREF. Signal OUT2/3 is delayed with respect to CKREF two thirds as much as signal OUT3/3 is delayed with respect to CKREF. Output lead 117 of VCDL 113 and output lead 144 of DLL 101 are the same conductor. Output lead 119 of VCDL 113 and output lead 145 of DLL 101 are the same conductor. Output lead 120 of VCDL 113 and output lead 146 of DLL 101 are the same conductor.

Figure 9:
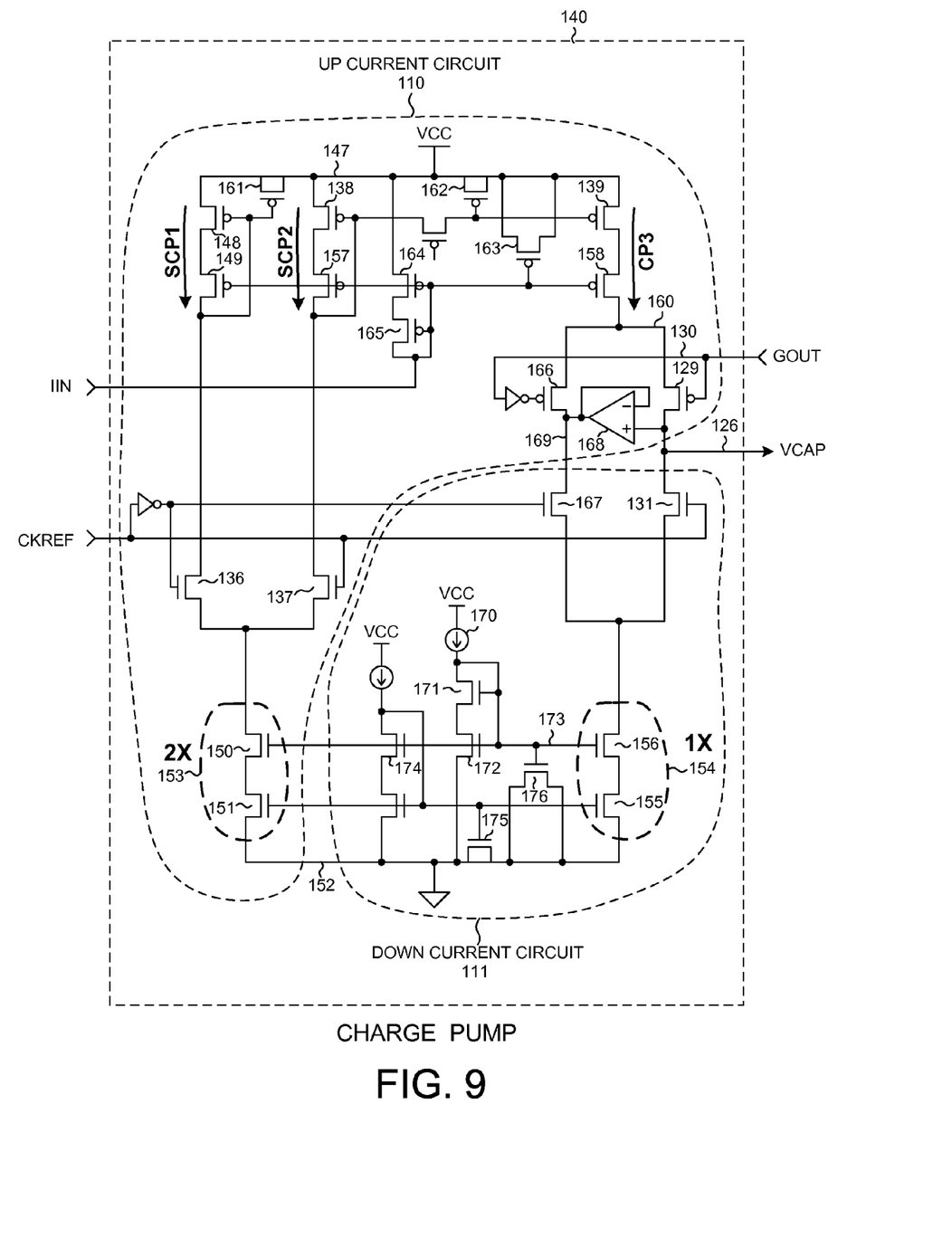
FIG. 9 is a circuit diagram of the charge pump 140 of the DLL of FIG. 8.

FIG. 9 is a more detailed circuit diagram of charge pump 140 of FIG. 8. A first switched current path SCP1 extends from supply voltage node 147, through P-channel transistor 148 and P-channel cascode transistor 149, through N-channel transistor 136, and then through N-channel cascode transistor 150, and through current source N-channel transistor 151 to ground node 152. Transistors 150 and 151 form a current source 153. The current flow through current source 153 is twice as large as a mirrored current flowing through a second current source 154. The "2×" label on current source 153 and the "1×" label on current source 154 indicate this current relationship. Transistor 155 in current source 154 is a current source transistor that corresponds to current source transistor 151 in current source 153. Transistor 156 in current source 154 is a cascode transistor that corresponds to cascode transistor 150 in current source 153. The 2× current flows through this first switched current path SCP1 when transistor 136 is conductive, and transistor 136 is conductive when the signal CKREF has a low digital logic level. The relative magnitudes of the IUP and IDN currents can be changed during circuit design by changing the sizes of transistors 139 and 158 or can be changed during circuit operation by programmably changing the effective sizes of transistors 139 and 158 using programmable switches.

A second switched current path SCP2 extends from supply voltage node 147, through P-channel transistor 138 and P-channel cascode transistor 157, through N-channel transistor 137, and then current source 153 to ground node 152. The 2× current flows through this second switched current path SCP2 when transistor 137 is conductive, and transistor 137 is conductive when the signal CKREF has a high digital logic level.

Transistor 139 and transistor 138 form a current mirror. Transistor 158 is a cascode transistor that corresponds to cascode transistor 157. A third current path CP3 extends from supply voltage node 147, through current mirror transistor 139, through cascode transistor 158, and to node 160. Due to the current mirror involving transistors 139 and 138, this current flowing in the third current path CP3 is mirrored to the current flowing in the second switched current path SCP2. Transistors 148 and 149 are provided so that the load on transistor 136 is substantially the same as the load on transistor 137. Transistors 161, 162 and 163 are capacitances to filter noise. Transistors 164 and 165 bias the gate voltages of cascode transistors 149, 157 and 158. Increasing input current IIN causes the gate voltages to be decreased, whereas decreasing input current IIN causes the gate voltages to be increased.

As explained above in connection with FIG. 5, when signal GOUT on conductor 130 is at a low digital logic level, then P-channel transistor 129 is conductive and the IUP current flows through transistor 129 and to VCAP node 126. Current IUP is the current flow through the third current path CP3. When signal GOUT is at a high digital logic level, then P-channel transistor 129 is nonconductive and current IUP does not flow.

The down current circuit 111 draws the IDN current from VCAP node 126 when signal CKREF is at a high digital logic level. The IDN current flows from VCAP node 126, through conductive N-channel transistor 131, and through the 1× current source 154 and to ground node 152. When signal CKREF is at a low digital logic level, then N-channel transistor 131 is nonconductive and the IDN current does not flow.

If the current flowing through third current path CP3 is not able to flow out to VCAP node 126, then that current is allowed to flow through P-channel transistor 166 and to ground. Transistor 166 is controlled to be conductive if transistor 129 is not conductive. Similarly, if the 1× current flowing through current source 154 cannot be drawn from VCAP node 126, then this 1× current is allowed to be drawn through N-channel transistor 167. Operational amplifier 168 is connected as a unity gain amplifier that supplies the necessary current to or pulls the necessary current from node 169 such that the voltage on node 169 is kept equal to the voltage on node 126. Current source 170 and transistors 171 and 172 set the voltage on node 173 that biases the cascode transistors 150, 174, 172 and 156. Transistors 175 and 176 provide filtering capacitances.

Figure 10:
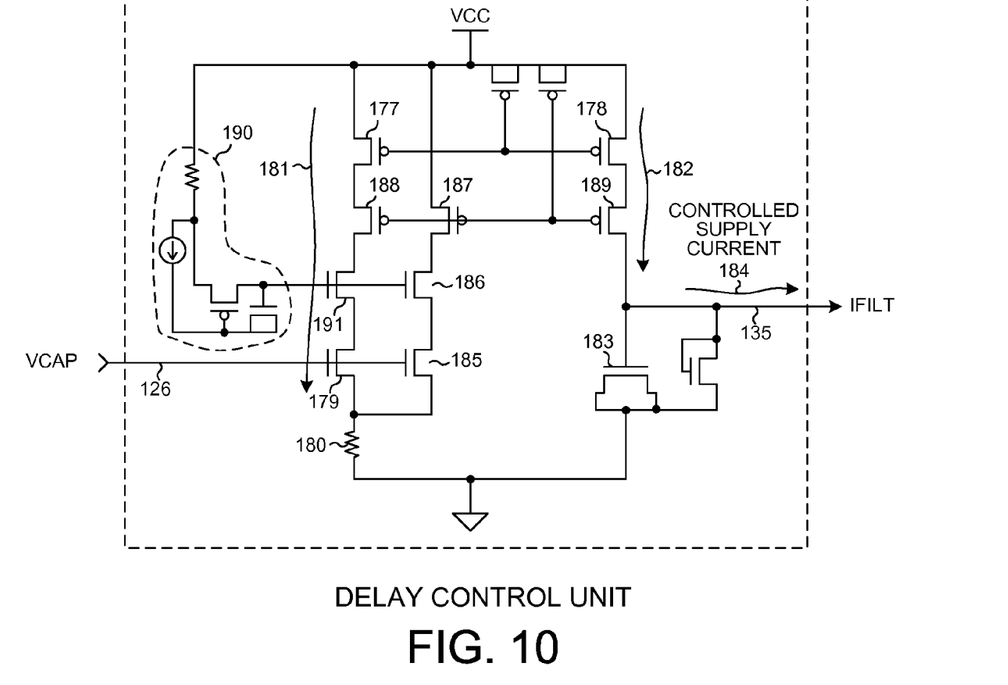
FIG. 10 is a circuit diagram of the Delay Control Unit (DCU) 134 of the DLL of FIG. 8.

FIG. 10 is a detailed circuit diagram of one example of the Delay Control Unit (DCU) 134 of FIG. 8. DCU 134 converts varying voltage signal VCAP into a stable control signal IFILT 184 that controls the delay time through the delay line. Control signal IFILT 184 in this example is a supply current whose magnitude is proportional to the DC component of the VCAP signal. The voltage VCAP sets the gate-to-source voltage of transistor 179. The voltage VCAP minus the gate-to-source voltage drop across transistor 179 sets the voltage drop across resistor 180, thereby setting the current 181. Transistors 177 and 178 form a current mirror. The resulting mirrored current 182 is smoothed by large capacitance 183 such that the voltage on node 135 is relatively constant over multiple periods of CKREF. The smoothed current 184 output via node 135 to the chain of delay elements 116 is therefore similarly a relatively constant current over multiple periods of CKREF. Transistors 185, 186 and 187 bias the gate voltages of cascode transistors 188 and 189 of the current mirror. Circuit 190 biases cascode transistors 191 and 186. The bandwidth of DCU circuit 134 of FIG. 10 is made to be much higher (>ten times higher) than the bandwidth of the overall DLL 101.

Figure 11:
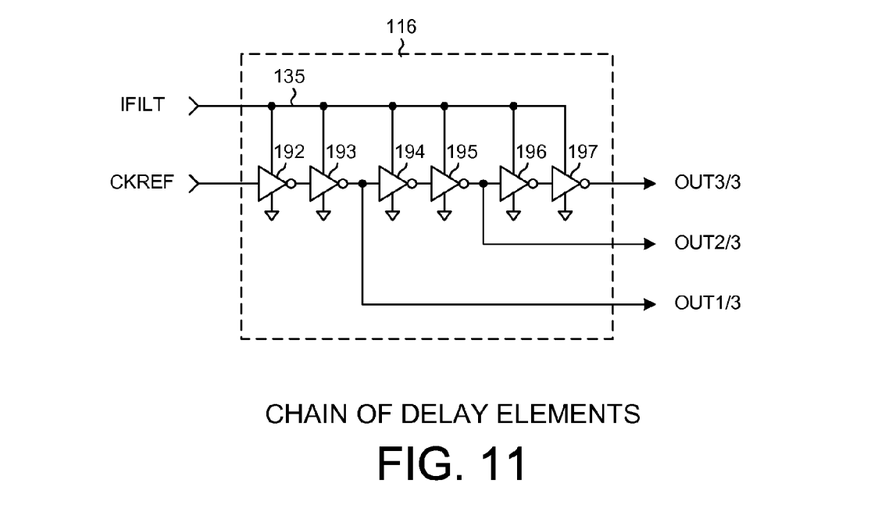
FIG. 11 is a circuit diagram of the chain of delay elements 116 of the DLL of FIG. 8.

FIG. 11 is a more detailed diagram of the chain of delay elements 116 of FIG. 8. Increasing the amount of supply current IFILT 184 supplied via input node 135 to inverters 192-197 decreases the propagation delay through the chain of inverters whereas decreasing the amount of supply current IFILT 184 supplied via input node 135 to inverters 192-197 increases the propagation delay.

Figure 12:
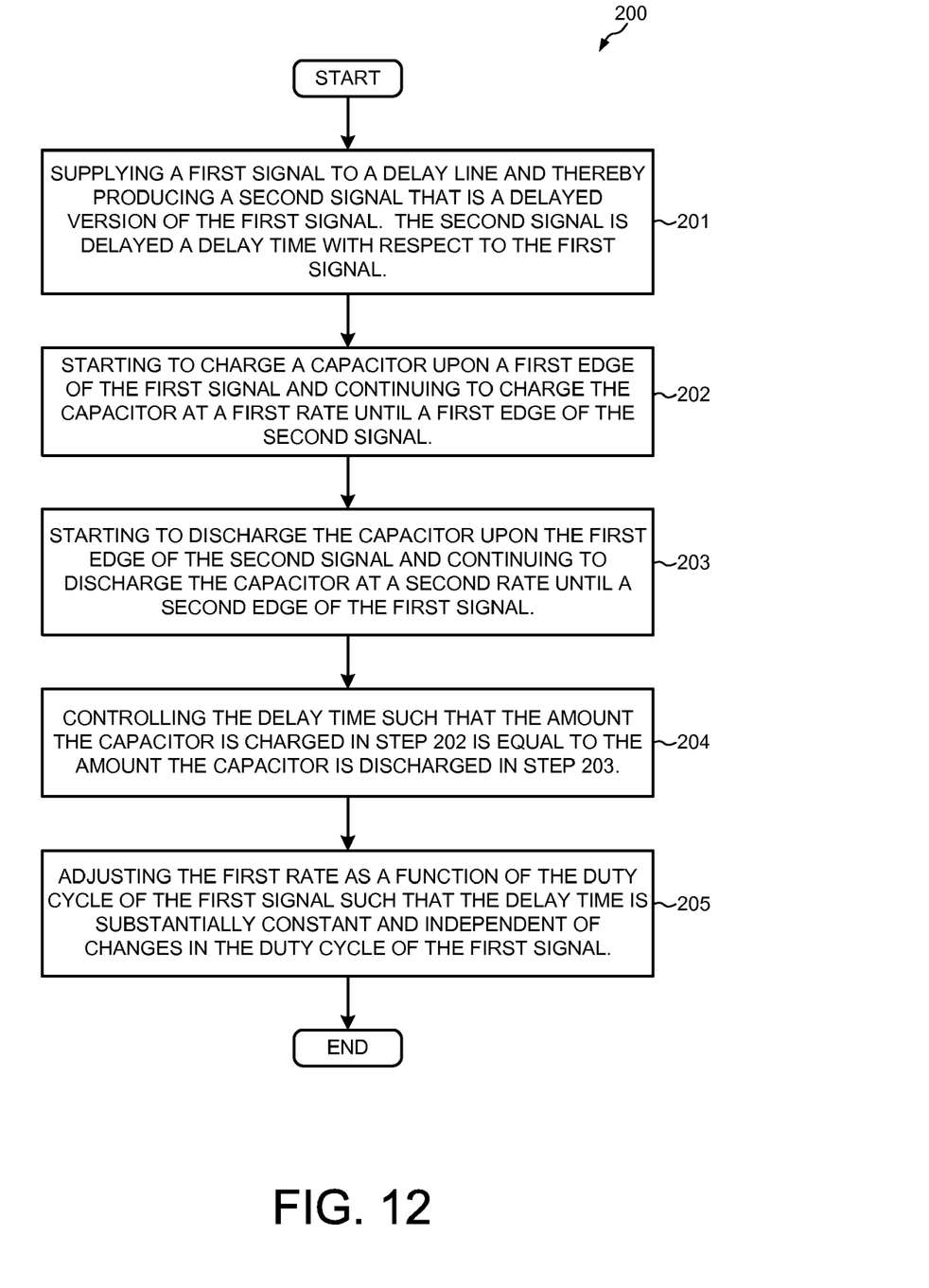
FIG. 12 is a flowchart of a method 200 of operation of the first embodiment of the DLL of FIG. 8.

FIG. 12 is a flowchart of a method 200 of operation of the first embodiment 101 of the DLL of FIG. 8. In a first step (step 201), a first signal is supplied to a delay line so that a second signal is produced. The second signal is a delayed version of the first signal. The second signal is delayed a "delay time" with respect to the first signal. In one example of the method, the first signal is signal CKREF in FIG. 8 and the second signal is signal OUT3/3 in FIG. 8.

In a second step (step 202), a charging of a capacitor is started upon a first edge of the first signal. This charging continues at a first rate until a first edge of the second signal. In one example of the method, the capacitor is capacitor 112 of FIG. 8, the first edge of the first signal is edge 124 of FIG. 6, the first edge of the second signal is edge 125 of FIG. 6, and the first rate is slope SU1 of FIG. 6.

In a third step (step 203), a discharging of the capacitor is started upon the first edge of the second signal. This discharging continues at a second rate until a second edge of the first signal. In one example of the method, the second edge of the first signal is edge 127 of FIG. 6 and the second rate is slope SD1 of FIG. 6.

In a fourth step (step 204), the delay time is controlled such that an amount the capacitor is charged in the second step is equal to the amount the capacitor is discharged in the third step. In one example of the method, the delay time is controlled by controlling the supply current IFILT supplied by DCU 134 to delay line 116 of FIG. 8. Although the controlling of the delay time is set forth here as the fourth step, the label "fourth" does not indicate an order or that previously enumerated steps have been completed. The controlling of the delay time is an ongoing control function and takes place continually over many periods of CKREF.

In a fifth step (step 205), the first rate is adjusted as a function of the duty cycle of the first signal such that the delay time is substantially constant and independent of changes in the duty cycle of the first signal. In one example of the method, the first rate is adjusted relatively gradually from period to period of CKREF. If the duty cycle of the first signal is 45/55, then the first rate may be adjusted to be slope SU2 as illustrated in waveforms 122 of FIG. 6. If the duty cycle of the first signal is 55/45, then the first rate may be adjusted to be slope SU3 as illustrated in waveforms 123 of FIG. 6. Again, as in the case of the fourth step, this fifth step of adjusting the first rate as a function of duty cycle does not have to take place sequentially after the steps 201-204 have been completed. The label "fifth" does not indicate an order and does not require that previously enumerated steps have been completed. The adjusting of the first rate occurs at a relatively slow rate compared to the frequency of CKREF.

Figure 13:
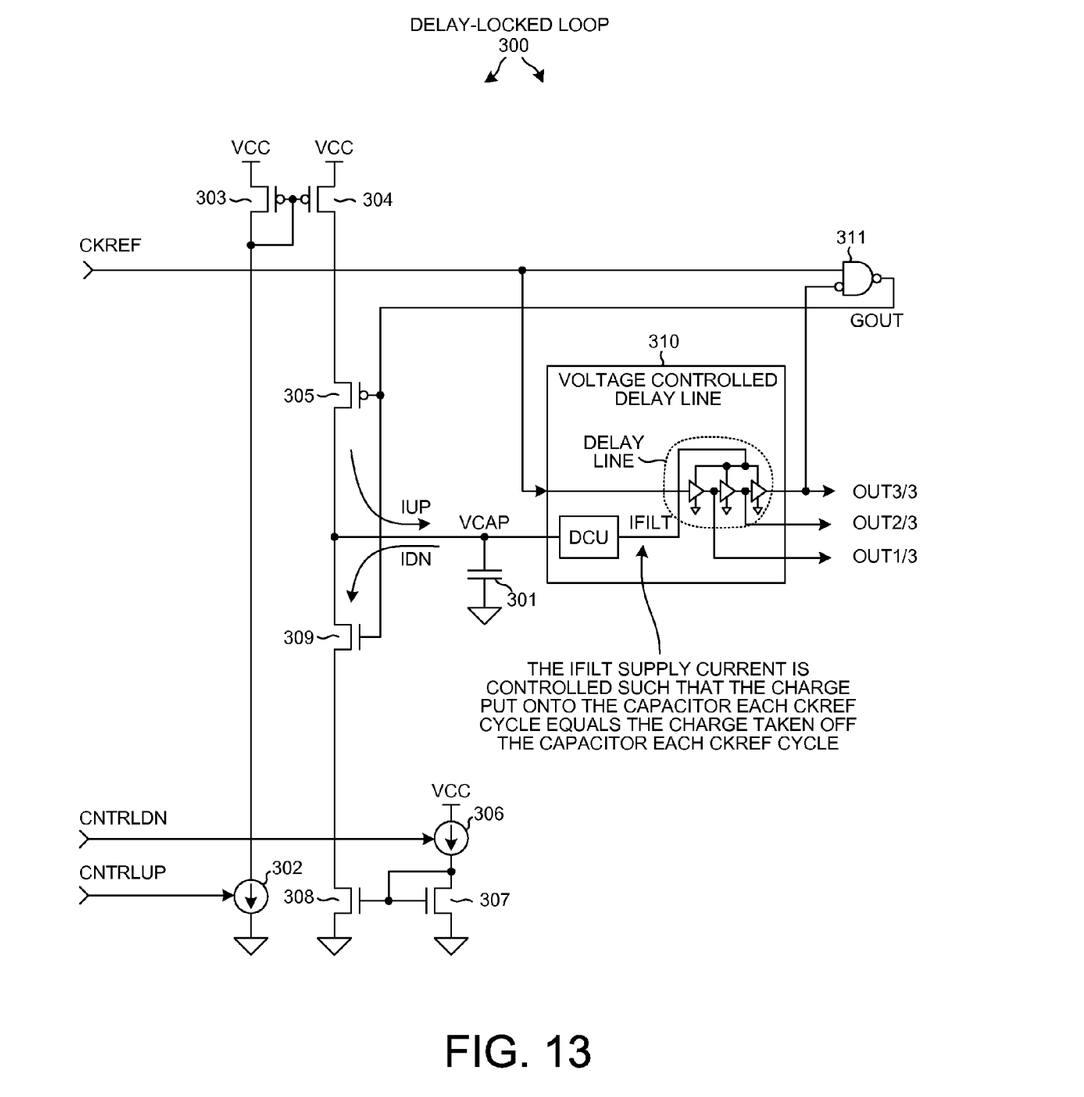
FIG. 13 is a circuit diagram of a second embodiment 300 of the DLL of the system of FIG. 4.

FIG. 13 is a circuit diagram of a second embodiment 300 of the DLL of FIG. 4. Unlike the first embodiment 101 of FIG. 5, the second embodiment 300 of FIG. 13 charges capacitor 301 at a rate that is independent of the duty cycle of signal CKREF. There are no transistors in FIG. 13 that correspond to the transistors 136 and 137 of FIG. 5. The rate at which capacitor 301 is charged is set by controlled current source 302. The current flowing through current source 302 is mirrored through mirroring transistors 303 and 304. This current IUP is allowed to charge capacitor 301 when P-channel transistor 305 is on and conductive. The rate at which capacitor 301 is discharged is set by controlled current source 306 and mirroring transistors 307 and 308. This discharge current IDN is allowed to flow from capacitor 301 when N-channel transistor 309 is on and conductive. VCDL 310 and logic gate 311 of FIG. 13 are of identical construction to the VCDL 113 and logic gate 114 of FIG. 5.

Figure 14:
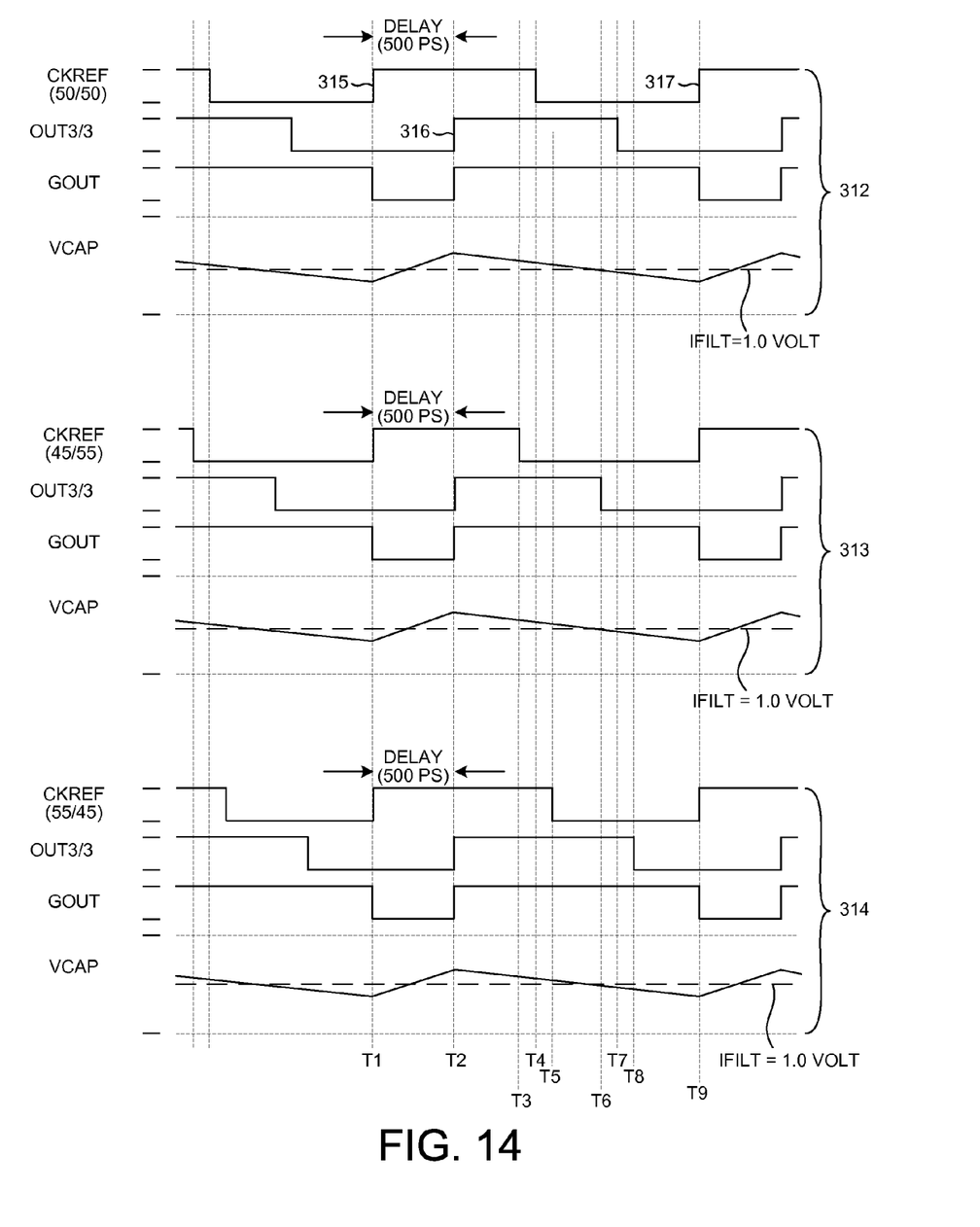
FIG. 14 is a waveform diagram that illustrates operation of the second embodiment 300 of the DLL of FIG. 13.

FIG. 14 a waveform diagram that illustrates operation of the second embodiment 300 of FIG. 13. Waveforms 312 illustrate operation of DLL 300 when signal CKREF has a 50/50 duty cycle. Waveforms 313 illustrate operation of DLL 300 when signal CKREF has a 45/55 duty cycle. Waveforms 314 illustrate operation of DLL 300 when signal CKREF has a 55/45 duty cycle. When signal GOUT is at a digital logic low, P-channel transistor 305 is conductive (IUP flows) and N-channel transistor 309 is nonconductive (IDN does not flow). Starting on a first edge 315 at time T1 of a period of the incoming clock signal CKREF, the capacitor 301 is charged by current flow IUP. The voltage VCAP on capacitor 301 increases. This rate of charge is independent of the duty cycle of the signal CKREF and is set by control signal CNTRLUP. The duration of the charging is independent of the duty cycle of the signal CKREF.

Then, starting on a first edge 316 of the signal OUT3/3, the capacitor 301 is discharged by current flow IDN. When signal GOUT is at a digital logic high, P-channel transistor 305 is nonconductive (IUP does not flow) but N-channel transistor 309 is conductive (IDN flows). The voltage VCAP on capacitor 301 therefore starts to decrease. The decreasing of the voltage on capacitor 301 continues until a second edge 317 of the signal CKREF. The duration of the discharging of capacitor 301 from time T2 to time T9 is therefore independent of the duty cycle of signal CKREF. The rate of discharge is also independent of the duty cycle of signal CKREF and is set by control signal CNTRLDN. Accordingly, the VCAP waveform in each of the duty cycle examples 312-314 of FIG. 14 is the same. In DLL 300 of FIG. 13, the first and second edges 315 and 317 of the signal CKREF delimit a period of the signal CKREF. At all times throughout this period, capacitor 301 is either being charged or is being discharged. The first edge 316 of the signal OUT3/3 that determines when charging stops and discharging starts is a delayed version of the first edge 315 of signal CKREF.

Figure 15:
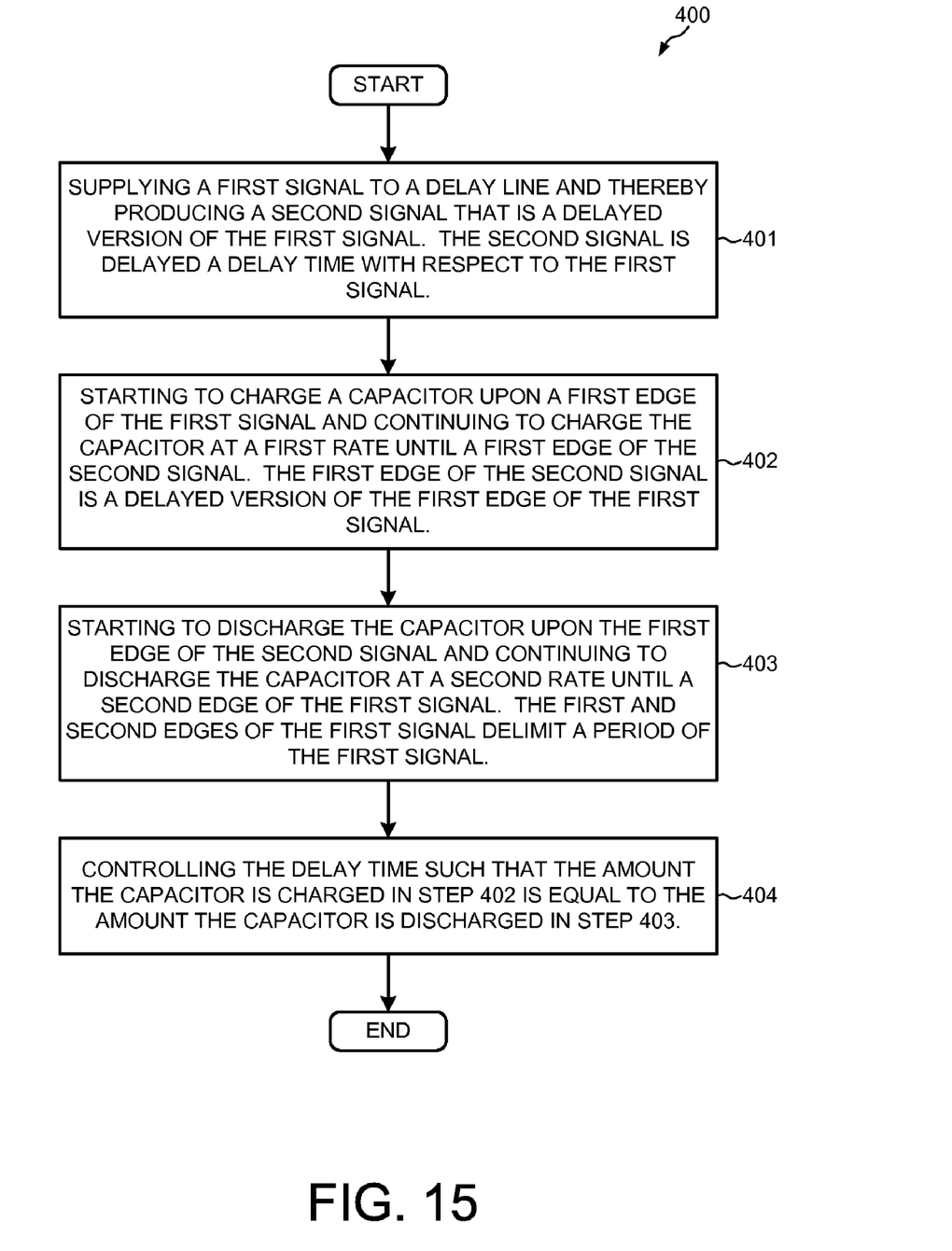
FIG. 15 is a flowchart of a method 400 of operation of the second embodiment 300 of the DLL of FIG. 13.

FIG. 15 is a flowchart of a method 400 of operation of the second embodiment 300 of the DLL of FIG. 13. In a first step (step 401), a first signal is supplied to a delay line so that a second signal is produced. The second signal is a delayed version of the first signal. The second signal is delayed a "delay time" with respect to the first signal. In one example of the method, the first signal is signal CKREF in FIG. 13 and the second signal is signal OUT3/3 in FIG. 13.

In a second step (step 402), a charging of a capacitor is started upon a first edge of the first signal. This charging continues at a first rate until a first edge of the second signal. In one example of the method, the capacitor is capacitor 301 of FIG. 13, the first edge of the first signal is edge 315 of FIG. 14, the first edge of the second signal is edge 316 of FIG. 14. The first rate is independent of the duty cycle of the first signal. The duration of the charging from time T1 to time T2 is also independent of the duty cycle of the first signal.

In a third step (step 403), a discharging of the capacitor is started upon the first edge of the second signal. This discharging continues at a second rate until a second edge of the first signal. In one example of the method, the second edge of the first signal is edge 317 of FIG. 14. The second rate is independent of the duty cycle of the first signal. The duration of the discharging from time T2 to time T9 is also independent of the duty cycle of the first signal.

In a fourth step (step 404), the delay time is controlled such that an amount the capacitor is charged in the second step is equal to the amount the capacitor is discharged in the third step. Although the controlling of the delay time is set forth here as the fourth step, the label "fourth" does not indicate an order or that previously enumerated steps have been completed. The controlling of the delay time is an ongoing control function and takes place continually over many periods of CKREF.

Although certain specific embodiments are described above for instructional purposes, the teachings of this patent document have general applicability and are not limited to the specific embodiments described above. In the first embodiment, either the up current or the down current can be varied so that it changes proportionally with respect to changes in the duty cycle of the input signal. Capacitor charging and discharging can be started and stopped using clock edges other than the particular edges used in the example set forth above. Either the up current, the down current, or both can be made software programmable. Control currents CNTRLDN and CNTRLUP can be set by USB driver software executed by a system CPU. The driver software supplies digital control values to software programmable current sources that in turn supply the currents CNTRLDN and CTRLUP to controllable current sources 306 and 302, respectively. The output signals OUT3/3, OUT2/3 and OUT1/3 are used to enable the stages of a multi-stage USB signal driver. Rather than initially adding a charge to a capacitor and then removing that charge during a period of the first signal as in the examples illustrated above, in other examples a charge can be initially removed from a capacitor and then that charge can be restored back into the capacitor in other examples. Although the edges of certain polarities are used to initiate and terminate charging and discharging in the examples above, these polarities are just examples. Signal edges having opposite polarities can be used in other examples. Although a supply current is described above as an example of a type of control signal usable to control the delay time of a delay line, other examples of control signals that control the delay time of a delay line can be used in other examples. Accordingly, various modifications, adaptations, and combinations of the various features of the described specific embodiments can be practiced without departing from the scope of the claims that are set forth below.

What is claimed is:

1. A method comprising:
   (a) supplying a first signal to a delay line thereby producing a second signal, wherein the first signal has a duty cycle, wherein the second signal is a delayed version of the first signal, and wherein the second signal is delayed a delay time with respect to the first signal;
   (b) starting to charge a capacitor upon a first edge of the first signal and continuing to charge the capacitor at a first rate until a first edge of the second signal;
   (c) starting to discharge the capacitor upon the first edge of the second signal and continuing to discharge the capacitor at a second rate until a second edge of the first signal; and
   (d) controlling the delay time such that an amount the capacitor is charged in (b) is equal to an amount the capacitor is discharged in (c) and such that the delay time is substantially independent of changes in the duty cycle of the first signal.

2. The method of claim 1, further comprising:
   (e) adjusting at least one of the first rate and the second rate as a function of the duty cycle of the first signal.

3. The method of claim 2, wherein one of the first and second edges of the first signal is a rising edge, wherein the other of the first and second edges of the first signal is a falling edge, and wherein the first and second edges of the first signal delimit a pulse of the first signal.

4. The method of claim 1, wherein the first and second edges of the first signal delimit a period of the first signal, wherein the first edge of the second signal is a delayed version of the first edge of the first signal, wherein the first rate at which the capacitor is charged remains substantially constant from period to period of the first signal despite changes in the duty cycle of the first signal, and wherein the second rate at which the capacitor is discharged remains substantially constant from period to period of the first signal despite changes in the duty cycle of the first signal.

5. The method of claim 1, further comprising:
   converting a voltage signal on the capacitor into a control current; and
   supplying the control current to the delay line, wherein the first signal is supplied in (a) into an input lead of the delay line, and wherein the second signal in (a) is output from an output lead of the delay line.

6. The method of claim 2, wherein the controlling of (d) and the adjusting of (e) occur on a constant basis over many periods of the first signal.

7. The method of claim 2, wherein the rate is adjusted in (e) to change proportionally with respect to changes in the duty cycle of the first signal.

8. The method of claim 1, further comprising:
   (e) programming the delay time by supplying a control signal that sets at least one of the first rate and the second rate.

9. A circuit comprising:
   a capacitor that starts to charge upon a first edge of a first signal and continues to charge until a first edge of a second signal, and that starts to discharge upon the first edge of the second signal and continues to discharge until a second edge of the first signal;
   a charging circuit that supplies charge to the capacitor;
   a discharging circuit that removes charge from the capacitor;
   a Voltage-Controlled Delay Line (VCDL) that has a first input lead, a second input lead, and an output lead, wherein the first signal is present on the first input lead of the VCDL, wherein the second input lead of the VCDL is coupled to the capacitor, wherein the second signal is present on the output lead of the VCDL, wherein the second signal is a delayed version of the first signal and is delayed a delay time with respect to the first signal, and wherein the delay time is substantially constant and independent of changes in the duty cycle of the first signal; and
   logic circuitry having a first input lead, a second input lead, and an output lead, wherein the first signal is present on the first input lead of the logic circuitry, wherein the second signal is present on the second input lead of the logic circuitry, and wherein the output lead of the logic circuitry is coupled to an input lead of the charging circuit.

10. The circuit of claim 9, wherein the first and second edges of the first signal delimit a pulse of the first signal, wherein the capacitor is charged at a rate starting at the first edge of the first signal and continuing until the first edge of the second signal, and wherein the rate is adjusted as a function of the duty cycle of the first signal.

11. The circuit of claim 9, wherein the first and second edges of the first signal delimit a period of the first signal, and wherein the first edge of the second signal is a delayed version of the first edge of the first signal.

12. The circuit of claim 10, wherein the charging circuit adjusts the rate so that the rate changes proportionally to changes in the duty cycle of the first signal.

13. The circuit of claim 12, wherein from a time of the first edge of the first signal to a time of the first edge of the second signal both the charging circuit is supplying charge to a capacitor node and the discharging circuit is removing charge from the capacitor node, and wherein the capacitor is coupled to the capacitor node.

14. The circuit of claim 9, wherein the charging circuit comprises:
   a first switched current path that passes through a current source;
   a second switched current path that passes through the current source, wherein the first and second switched current paths are switched such that a current flows through only one of the first and second switched current paths at a time, wherein current flows through the first switched current path if the first signal has a first digital logic level, and wherein current flows through the second switched current path if the first signal has a second digital logic level; and
   a third current path that extends to the capacitor, wherein current flow through the third current path is mirrored to current flow through the second switched current path.

15. The circuit of claim 9, wherein the VCDL includes a Delay Control Unit (DCU) circuit and a chain of delay elements, wherein the second input lead of the VCDL is an input lead of the DCU, wherein the DCU supplies a control current to the chain of delay elements, wherein the first input lead of the VCDL is a data input lead of the chain of delay elements, and wherein the output lead of the VCDL is a data output lead of the chain of delay elements.

16. A circuit comprising:
   a delay line that delays a first signal by a delay time and thereby generates a second signal, wherein the first signal has a duty cycle;
   a capacitor; and
   means for charging the capacitor and for discharging the capacitor and for converting a voltage signal on a lead of the capacitor into a control signal and for using the control signal to control the delay line such that the delay time is substantially independent of changes in the duty cycle of the first signal.

17. The circuit of claim 16, wherein the means charges the capacitor at a rate that is adjusted in proportion to changes in the duty cycle of the first signal.

18. The circuit of claim 16, wherein the means charges the capacitor at a first rate that is substantially independent of the duty cycle of the first signal, and wherein the means discharges the capacitor at a second rate that is substantially independent of the duty cycle of the first signal.

19. The circuit of claim 16, wherein the means begins charging the capacitor at a time of a first edge of the first signal and continues charging the capacitor until a time of a first edge of the second signal, and wherein the means begins to discharge the capacitor at the time of the first edge of the second signal and continues discharging the capacitor until a time of a second edge of the first signal.

20. The circuit of claim 19, wherein the first and second edges of the first signal delimit a pulse of the first signal, and wherein the first edge of the second signal is a delayed version of the first edge of the first signal.

21. The circuit of claim 19, wherein the first and second edges of the first signal delimit a period of the first signal, and wherein the first edge of the second signal is a delayed version of the first edge of the first signal.

22. The circuit of claim 16, wherein the means receives a delay time control input signal and uses the delay time control input signal to set the delay time.

\* \* \* \* \*